US009420074B2

(12) United States Patent
Ely et al.

(10) Patent No.: US 9,420,074 B2
(45) Date of Patent: Aug. 16, 2016

(54) LIGHT GUIDED ALIGNMENT FOR SEMI-AUTOMATED SEAL APPLICATION

(71) Applicant: Apple Inc., Cupertino, CA (US)

(72) Inventors: Colin M. Ely, Cupertino, CA (US); David Glenn Havskjold, Portola Valley, CA (US); Emery A. Sanford, San Francisco, CA (US); Tyson Benner Manullang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 131 days.

(21) Appl. No.: 14/271,374

(22) Filed: May 6, 2014

(65) Prior Publication Data

US 2015/0327412 A1 Nov. 12, 2015

(51) Int. Cl.
*H05K 13/00* (2006.01)
*H04M 1/02* (2006.01)
*H04M 1/24* (2006.01)

(52) U.S. Cl.
CPC ........... *H04M 1/026* (2013.01); *H05K 13/0015* (2013.01); *H04M 1/24* (2013.01); *H04M 2250/12* (2013.01); *Y10T 29/49897* (2015.01); *Y10T 29/53265* (2015.01)

(58) Field of Classification Search
CPC . H05K 13/0015; H05K 13/04; H05K 13/046; H05K 13/0469; H05K 2203/16; H05K 2203/167; H05K 2201/09918; Y10T 29/53265; Y10T 29/49897; Y10T 29/49895; B23P 19/002; B23P 19/04; B23P 19/10; B23P 19/107; B23Q 3/18; B23Q 3/183; B23Q 3/186
See application file for complete search history.

(56) References Cited

U.S. PATENT DOCUMENTS

2006/0042064 A1 * 3/2006 Montfort ............. H04N 5/2253
29/407.1

\* cited by examiner

*Primary Examiner* — David Bryant
*Assistant Examiner* — Jun Yoo
(74) *Attorney, Agent, or Firm* — Downey Brand LLP

(57) ABSTRACT

In one embodiment, a method of installing a component in an electronic device is described. A light source shines a light through an aperture of on one end of the electronic device. A light sensor positioned on the opposite end moves with a fixture having the component. When the light sensor determines a central portion of the light, the fixture and the component may be aligned with the aperture of the electronic device, and the fixture installs the component. In another embodiment, a method of detecting proper installment of the component is described. A microphone may be used to detect sound transmission from a speaker which transmits sound through the aperture. If the microphone detects sounds from an interface region between the component and the housing, the component is not properly installed.

12 Claims, 11 Drawing Sheets

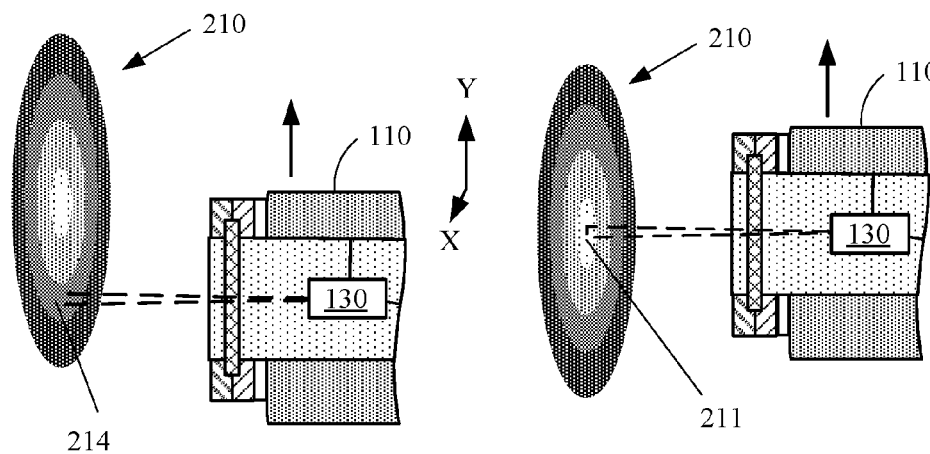
FIG. 6  FIG. 7
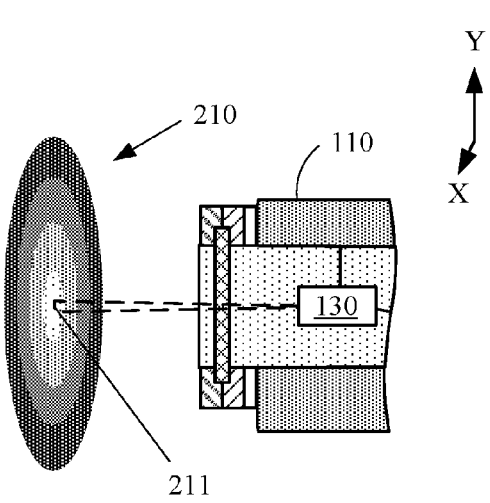
FIG. 8  FIG. 9

LIGHT GUIDED ALIGNMENT FOR SEMI-AUTOMATED SEAL APPLICATION

FIELD

The described embodiments relate generally to installing a component to a device. In particular, the present embodiments relate to aligning the component with an inner portion of an electronic device for installation of the component, and testing to ensure proper installation of the component once installed.

BACKGROUND

Proper installment of components in an electronic device generally leads to better overall performance of the electronic device. In order to properly install components in several electronic devices on an assembly line, it may be necessary to automate the process. One automation process includes a camera system having a charge-coupled device ("CCD") camera or a complementary metal-oxide semiconductor ("CMOS") camera used in conjunction with a software package configured to detect placement of components on the electronic device. The camera system may, for example, capture an image of the component on the electronic device and use the software package to compare the image with an image of a properly installed component.

However, camera systems are relatively expensive. In addition, several manual hours may be required to operate the camera system. For example, an operator must be properly trained on how the camera system works. Also, the camera systems may require proper alignment at all times which may be difficult in an assembly line. Realignment may also cost several manual hours. Also, variations in lighting within the assembly line may reduce the ability for the camera system to function in the desired manner.

SUMMARY

In one aspect, a method for aligning a component for installation in a housing of an electronic device is described. The method may include shining a light from a light source through an aperture of the housing, the light having a central portion. The method may also include actuating a fixture, the fixture having the component and a light sensor, along a first direction such that the light sensor detects the light. The method may also include aligning the light sensor with the central portion of the light.

In another aspect, a method for testing for proper installation of a component to a housing of an electronic device is described. The method may include transmitting a sound through an aperture of the housing, the sound originating from an outer portion of the housing. The method may also include transmitting the sound through an aperture of the component and a chamber of a fixture. The fixture is sealed to the component. The method may also include determining whether a portion of the sound is detected in an area proximate to an interface region of the housing and the component.

In another aspect, a fixture on an assembly line for manufacturing an electronic device is described. The fixture may include a first portion having a first cavity; the first cavity extending to a first opening on a surface of the first portion. The fixture may also include a second portion having a second cavity extending from a second opening on a second surface of the fixture to a third opening on a third surface of the fixture; the second cavity is substantially perpendicular to the first cavity and configured to receive a protrusion. The first cavity may include a cross sectional area substantially similar to a cross sectional area of an aperture of a component to be installed on the electronic device, and the fixture may be capable of rotating around a longitudinal axis of the protrusion.

A fixture on an assembly line for manufacturing an electronic device is described. The fixture may include a first cavity extending to a first opening on a first surface of the fixture. The fixture may also include a second cavity extending from a second opening on a second surface of the fixture to a third opening on a third surface of the fixture. The second cavity is capable of receiving a protrusion that actuates the fixture. The first cavity is smaller than an aperture of a component, the component configured to be installed on the electronic device. The fixture is capable of rotating about a longitudinal axis of the protrusion when the second cavity receives the protrusion.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which:

FIGS. 6-9 show an embodiment of the light sensor, fixture, and component traversing in the y-direction to find the central portion (or local maximum) of the light source;

Figure 1:
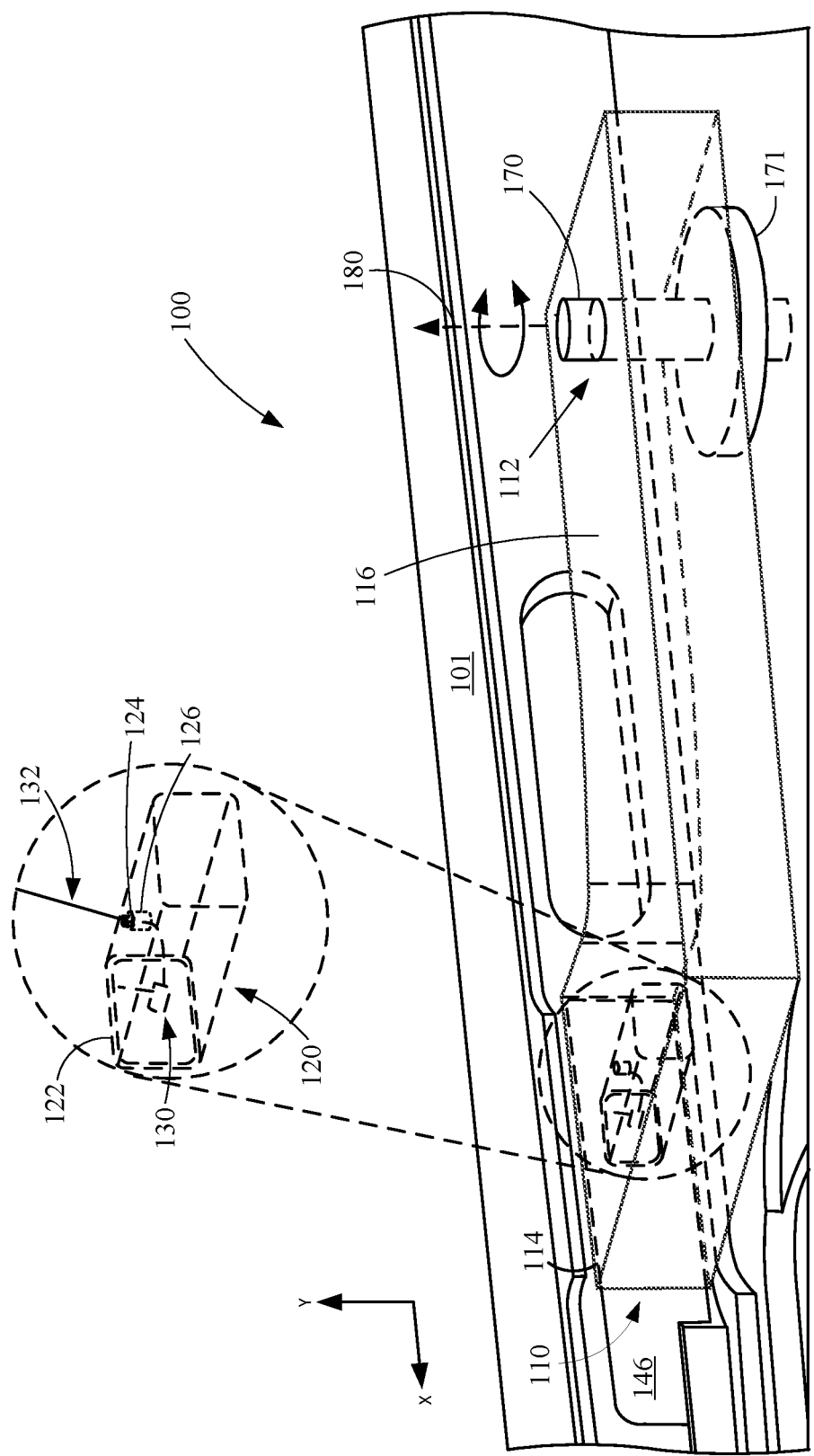
FIG. 1 shows an isometric view of an embodiment of a system used to align a component in an electronic device.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The following disclosure relates to aligning a component within a device (e.g., a tablet computer, portable electronic device) during an assembly process, as well as testing to ensure the component is properly installed. The component may include an acoustic seal. In one embodiment, the assembly process may include a fixture attached to a movable table, both of which are proximate to an inner portion of a housing of the device. The fixture may be configured to rotate at least partially around an axis. A light sensor may also be positioned within a chamber of the fixture. The component and a release layer may also be positioned on an outer surface of the fixture. Light from a light source passes through an aperture of the housing of the device to the light sensor. The movable table may move the fixture in multiple directions allowing the light sensor to determine the area of highest light intensity ("local maximum") of the light source. The light source is positioned such that the local maximum extends through a central portion of the aperture of the housing. Using information from the light sensor, the movable table may move the fixture, and accordingly, the component, to the local maximum. The fixture may then move in a direction toward the inner surface to install the component.

In another embodiment, an acoustical test ensures a component is properly installed. The component is attached to an inner surface of a housing of a device, and configured to extend around an aperture of the housing. A pressure sensitive adhesive ("PSA") may be used to attach the component to the housing. An audio speaker is placed on an outer portion of the housing. A microphone may be attached to a fixture substantially similar to the fixture previously described. The acoustical test may be performed by emitting sound from the audio speaker and through the aperture of the housing, an aperture of the component, and into a chamber of the fixture. If the microphone does not detect the emitted sound, the component is properly installed. If the microphone detects the emitted sound, the component is not properly installed. The acoustical test is generally performed during early stages of the assembly. Thus, if improper installation is detected, the housing may be discarded from the assembly process with minimal assembly rather discarding a fully assembled device.

Also, this combined test and assembly step is at least one less step used to assemble the device which may contribute to lower manufacturing time and cost.

For purposes of clarity, the term "longitudinal" as used throughout this detailed description and in the claims refers to a direction extending a length or major axis of a component. Also, the phrase "acoustically sealed" as used throughout this detailed description and in the claims refers to two structures engaged with one another such that sound cannot pass through a portion where the two structures are engaged.

FIGS. 1-4 illustrate a portion of an assembly station for assembling device 100. The device 100 may be a device such as a tablet computer, mobile telecommunications device (for example, smartphone), or portable laptop computer. FIG. 1 shows an isometric view of the assembly station having fixture 110 configured to attach a component to housing 101 of the device. The component may be an acoustic seal configured to prohibit dust or other contaminants from entering an aperture of device 100. Generally, fixture 110 may be any structure used in an assembly process capable of affixing small components to a device 100. In some embodiments, the component may be a button. In the embodiment shown in FIG. 1, fixture 110 is configured to install a component, or microphone seal (discussed later). Also, in some embodiments, fixture 110 may be made of plastic, metal, or a combination thereof. In the embodiment shown in FIG. 1, fixture 110 is made of aluminum. Also, fixture 110 is generally "L-shaped" but could be any shape in order to achieve a desired result, such align and install a component and/or provide an installation test (discussed later). In this case, fixture 110 is designed to traverse on the assembly station such that first aperture 122 of fixture 110 engages an aperture (shown later) of housing 101.

FIG. 1 further shows an enlarged view of fixture 110 having chamber 120. For purposes of clarity, some structures in the enlarged view are removed. Chamber 120 is a cavity within fixture 110 extending from one end inside fixture 110 to first aperture 122 located on lateral surface 114 of fixture 110. In some embodiments, first aperture 122 is a cylindrical shape. In the embodiment shown in FIG. 1, first aperture 122 is generally rectangular. Generally, first aperture 122 is designed to have an area larger than that of an aperture of housing 101. This will be discussed later in detail. Chamber 120 is generally of a dimension similar to that of first aperture 122 throughout chamber 120. Also, chamber 120 is configured to receive light sensor 130 used to align fixture 110 (and ultimately, the component) with the aperture of housing 101. Light sensor 130 may be a photoelectric sensor, or any other device configured to detect light from a light source external to housing 101 and determine the light intensity from the light source. As shown in FIG. 1, light sensor 130 is attached to a top portion of chamber 120. Fixture 110 further includes second aperture 124 on top surface 116 of fixture, and cavity 126 extending from top surface 116 of fixture 110 to an opening of chamber 120. Cavity 126 and second aperture 124 allow light sensor 130 to electrically connect to a power source and/or an input module of a controller or programmable unit (not shown) via conductive element 132. In other embodiments, conductive element 132 may extend through a cavity (not shown) to electrically connect with the power source, controller, and/or programmable unit.

Also, fixture 110 includes pinhole 112 configured to receive column 170. Column 170 passes through fixture 110 and support member 171, and is attached to a movable table (not shown) configured to move in both a horizontal ("x") direction and vertical ("y") direction. Column 170 and support member 171 may also be rotated by the movable table around longitudinal axis 180 of column 170. Accordingly, fixture 110 may also move in the same directions as column 170 and support member 171. Advances in drilling techniques allow for high precision in forming pinhole 112 such that when column 170 engages fixture 110, fixture 110 is configured to have relatively low tolerances. In other words, there is little unwanted movement of fixture 110 with respect to column 170.

Release layer 146 is configured to detach from lateral surface 114 once the component is installed on housing 101. A first surface of release layer 146 is attached to lateral surface 114 of fixture 110. A second surface (shown later) of release layer 146 may be attached to the component to be installed on housing 101. Also, when the component is installed, release layer 146 is further configured to detach from the component.

Figure 2:
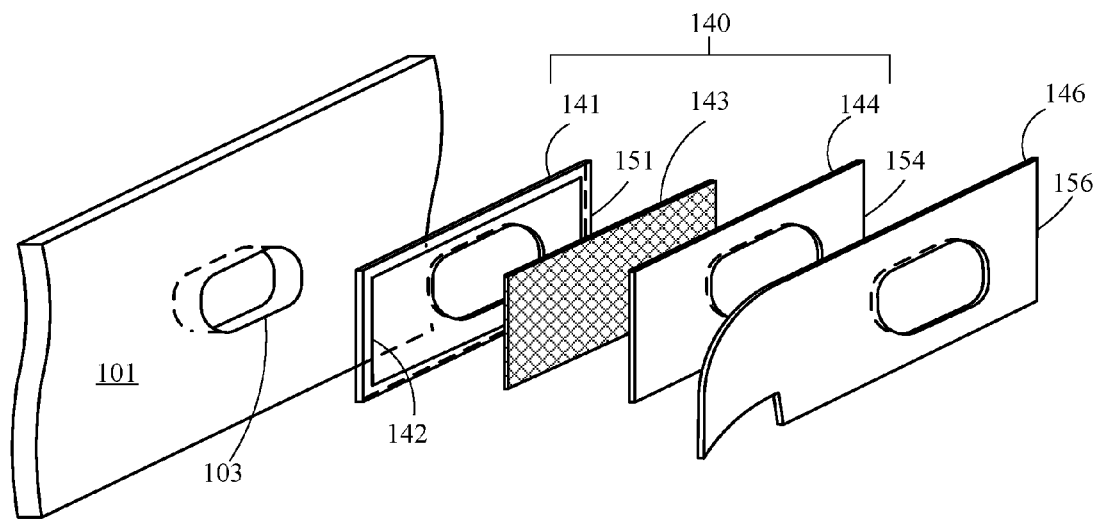
FIG. 2 shows an exploded view of an embodiment of a component near an embodiment of a housing of the electronic device.
Figure 3:
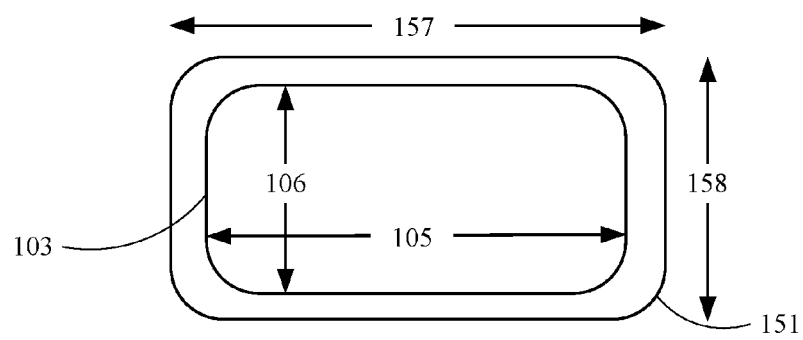
FIG. 3 shows a dimensional comparison of an aperture in the embodiment of the component and an aperture in the embodiment of the housing, both of which are shown in FIG. 2.

FIGS. 2 and 3 illustrate the relationship of housing 101 and component 140. FIG. 2 shows an exploded view of component 140 having first portion 141, mesh portion 143, and second portion 144. First portion 141 includes recessed portion 142 and second portion 144 includes a recessed portion (not shown), both of which are configured to receive mesh portion 143. Accordingly, some of the dimensions of mesh portion 143 are less than that of first portion 141 and second portion 144. Also, first portion 141 further includes aperture 151, second portion 144 includes aperture 154, and release layer 146 includes aperture 156. Also, as shown in FIG. 2, aperture 151, aperture 154, and aperture 156 are generally of the same dimensions. Also, although aperture 151, aperture 154, and aperture 156 are generally rectangular, these apertures could embody a different shape such that the apertures maintain dimensions larger than that of aperture 103. Referring to FIG. 3, aperture 151 includes length 157 and width 158. Aperture 103 of housing 101, on the other hand, is smaller than that of aperture 151. In particular, aperture 103 includes length 105 and width 106 that are less than length 157 and width 158, respectively. This allows aperture 103 to be positioned within aperture 151, or conversely, for aperture 151 to extend around aperture 103 without directly contacting aperture 103. The smaller cross sectional area of aperture 103 as compared to the cross sectional area of aperture 151 allows a pressure sensitive adhesive ("PSA") (not shown) to be applied to a surface of first portion 141 that faces housing 101 such that first portion 141 adhesively attaches to housing 101 without first portion 141 contacting any portion of aperture 103. It should be noted this alignment is preferred in the assembly of the device.

Referring again to FIG. 2, mesh portion 143 made of a generally porous material. This allows light and/or sound waves to pass through mesh portion 143. Despite the porous material, mesh portion 143 is configured to prevent certain contaminants (such as dust or liquid) from entering the device. Also, mesh portion 143 may also contribute to the acoustic performance of the device.

Figure 4:
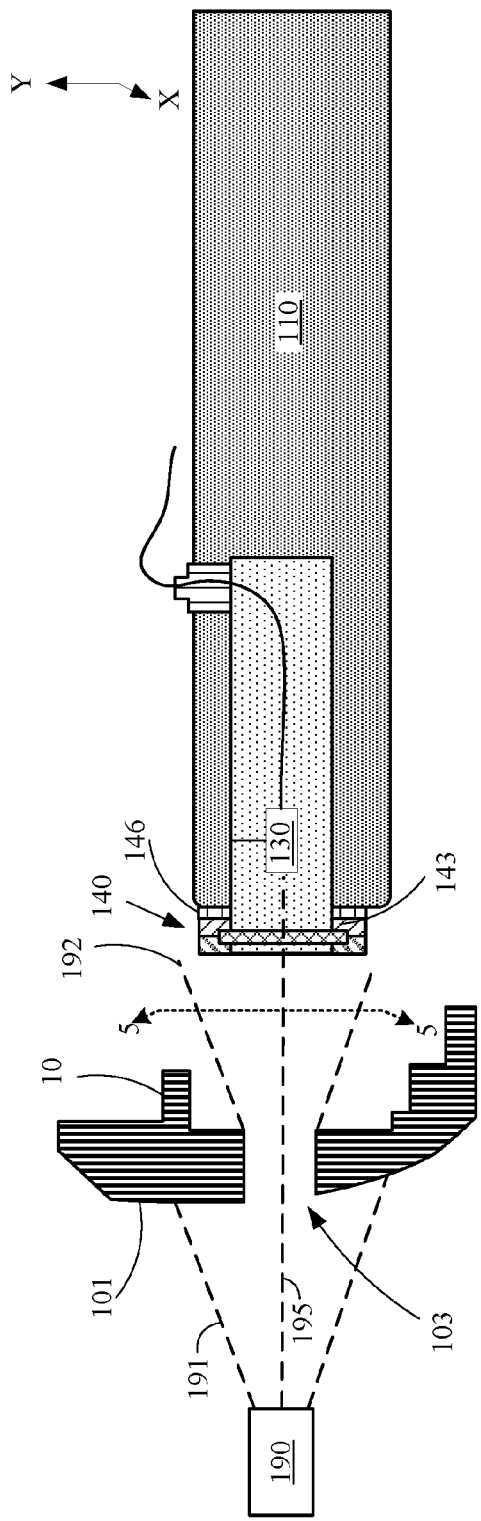
FIG. 4 shows a cross sectional view of the embodiment of the system shown in FIG. 1 with a light source shining light into the housing.

FIGS. 4-10 illustrate the alignment process for component 140 onto housing 101. In FIG. 4, light source 190 directing light toward aperture 103. In some embodiments, light source 190 is a laser. In other embodiments, light source 190 could be an infrared light source. Still, in other embodiments, light source 190 could be of a particular color (such as visible red). These embodiments may be useful in order to allow light sensor 130 to accurately detect light from light source 190. In the embodiment shown in FIG. 4, light source 190 is a collimated white light. In other words, the white light emits several light rays, some of which are generally parallel to each other. As shown in FIG. 4, only a portion of the light from light source 190 may reach light sensor 130. The alignment process is configured such that aperture 103 trims or clips some of the light while allowing some of the light to pass through aperture 103. For example, light ray 191 contacting housing 101 may be reflected by, or absorbed by, housing 101 but does not pass through aperture 103. Light ray 192, however, passes through aperture 103. Light passing through aperture 103 may also pass through the aperture of component 140 (that is, the apertures of the portions of component 140 as well as mesh portion 143) and through the aperture of release layer 146. This light may be detected by light sensor 130.

Figure 5:
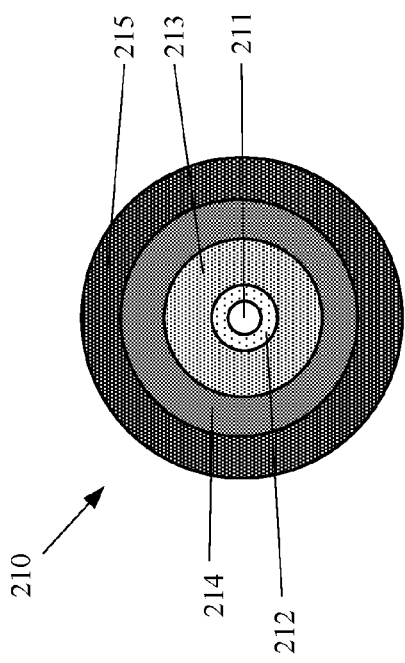
FIG. 5 shows a cross sectional cutaway along the 5-5 line in FIG. 4 showing an embodiment of a light gradient created by the light source.

Light passing through aperture 103 may be having a higher intensity in some portion as compared others. In other words, the light may be brighter in some areas than in other areas. For example, FIG. 5 shows light gradient 210 taken along the line 5-5 in FIG. 4. In some embodiments, the light source and the aperture are configured to form light gradient 210 of several intensities. For example, light gradient 210 may include first intensity 211, second intensity 212, third intensity 213, fourth intensity 214, and fifth intensity 215. The light intensity of light gradient 210 is highest in the center of light gradient 210 than the outermost region. In other words, first intensity 211 has a higher light intensity than that of second intensity 212, and so on. Also, first intensity 211 may also be referred to as a local maximum of the light from light source 190. Generally, first intensity 211 is at the center of the light and also corresponds to the brightest component of the light.

Light sensor 130 (shown in FIG. 4) is configured to detect all intensities of light gradient 210. Also, light source 190 (shown in FIG. 4) is aligned with aperture 103 such that first intensity 211 having light ray 195 extending through a central portion of aperture 103. Accordingly, when light sensor 130 detects first intensity 211, light sensor 130 and fixture 110 may be properly aligned with housing 101 and/or aperture 103. Also, fixture 110 generally has low tolerance requirements not only in a rotational direction, but also a vertical direction. For example, FIG. 4 shows component having lip portion 10. Component 140 must be installed without contacting lip portion 10. As such, it is critical to avoid unwanted movement in the y-direction. Therefore, aligning fixture 110 with the local maximum of light gradient is important to ensure that component 140 and/or fixture 110 do not contact lip portion 10 of housing 101.

FIGS. 6-9 illustrate fixture 110 traversing in a first direction relative to light gradient 210 in order to align component 140 with the aperture of the housing. In some embodiments, the first direction is in the x-direction. In the embodiment shown in FIGS. 6-9, the first direction is the y-direction. Light sensor 130 may be configured as an input device to a controller (not shown), such as a programmable logic controller ("PLC"). Also, light sensor 130 may transmit current (on the order of milliamps) to signal the light intensity read by light sensor 130. For example, a low current transmitted by light sensor 130 corresponds to a low light intensity, and a relatively higher current transmitted corresponds to a higher light intensity. The controller may be configured to read the light intensity readings from light sensor 130 (for example, by converting current into a light intensity) and signal a motor to drive a movable table (not shown), such as an X-Y table. The controller may be proximate to fixture 110 or may be located in another portion of the assembly process. Fixture 110, connected to the movable table, may move fixture 110 in the x-direction and/or the y-direction in order to properly align component 140 with an aperture of the housing as previously described. In other embodiments, light sensor 130 is coupled directly to a motor configured to move a movable in response to current readings by light sensor 130.

FIG. 6 shows light sensor 130 reading a light intensity corresponding fourth intensity 214 of light gradient 210 (shown in FIG. 5). In order to determine whether the portion of light gradient 210 read by light sensor 130 is the highest intensity of light gradient 210, the movable table actuates fixture 110 to traverse along the y-direction to take further readings. As shown in FIG. 7, light sensor 130 reads a light intensity corresponding first intensity 211 of light gradient 210. While the controller may determine first intensity 211 has a greater intensity than that of fourth intensity 214, the movable table may further actuate fixture 110 to traverse along the y-direction to take further readings. As shown in FIG. 8, light sensor 130 reads a light intensity corresponding fourth intensity 214 of light gradient 210. At this point, the controller may determine that fixture 110 is traversing along the y-direction in a direction of decreasing light intensity, and signal for the movable table to retract (or travel in the opposite direction) to a position along the y-direction to the position corresponding to the position in which light sensor 130 previously detected first intensity 211, as shown in FIG. 9. At this point, the component 140 is aligned with the local maximum of light intensity, and therefore, the aperture of the housing. A similar process may be repeated in the x-direction in order to further align component 140 with the local maximum. In other embodiments, the alignment process may be programmed to run for a predetermined period of time (for example, 1-5 seconds) and then actuate fixture 110 to a position corresponding to the local maximum, or highest light intensity, during the predetermined period.

Figure 10:
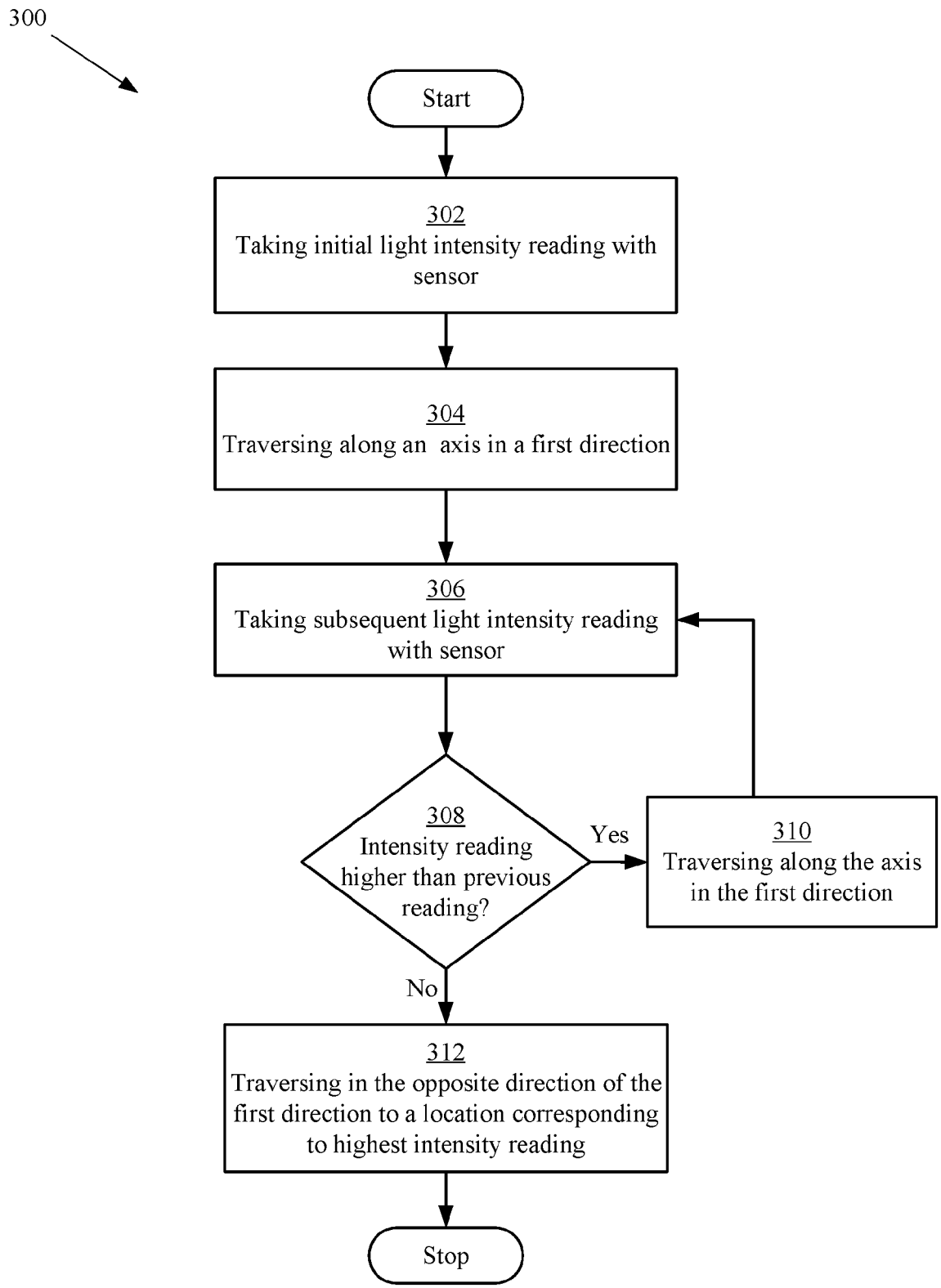
FIG. 10 shows a flow chart of an alignment process in accordance with the described embodiments.

FIG. 10 is a flow chart 300 which details an alignment process. In a first step 302, the light sensor takes an initial light intensity reading to determine the light intensity of the light gradient at a given location. The initial reading may be transmitted to a device such as a controller. Then in step 304, the light source and the fixture traverse along a first direction to take an additional reading of the light gradient. The first direction could be the x-direction or the y-direction. Then in step 306, the light sensor takes another reading. In step 308, the controller may compare the initial reading to the subsequent reading. If the subsequent reading is higher than the initial reading, as shown in step 310, the alignment process may be repeated beginning at step 306. If, on the other hand, at step 308 it is determined that the subsequent reading is less than the initial reading, then in step 312, the light sensor and the fixture traverse in the opposite direction of the first direction to a position corresponding the highest intensity reading as determined by the light sensor. It should be understood that the alignment process could include traversing in a second direction that is substantially perpendicular to the first direction. For example, the alignment process could traverse in the x-direction if the process has traversed in the y-direction.

Contrary to the white light previously described, laser light is generally a focused light source of a single light intensity. Referring again to FIG. 4, in embodiments where light source 190 is a laser light, light sensor 130 may generally act as a switch. In other words, rather than detecting various light intensities, light sensor 130 may switch to an "on" state when the laser light is detected and switch to an "off" at all other light intensities (for example, ambient light). As such, when laser light passes through the central portion of aperture 103, the controller may signal for fixture 110 to stop when light sensor 130 detects the laser light. It should be understood that the cross section of the laser light also generally represents the "local maximum" of the laser light due to the characteristics of the laser light.

Figure 11:
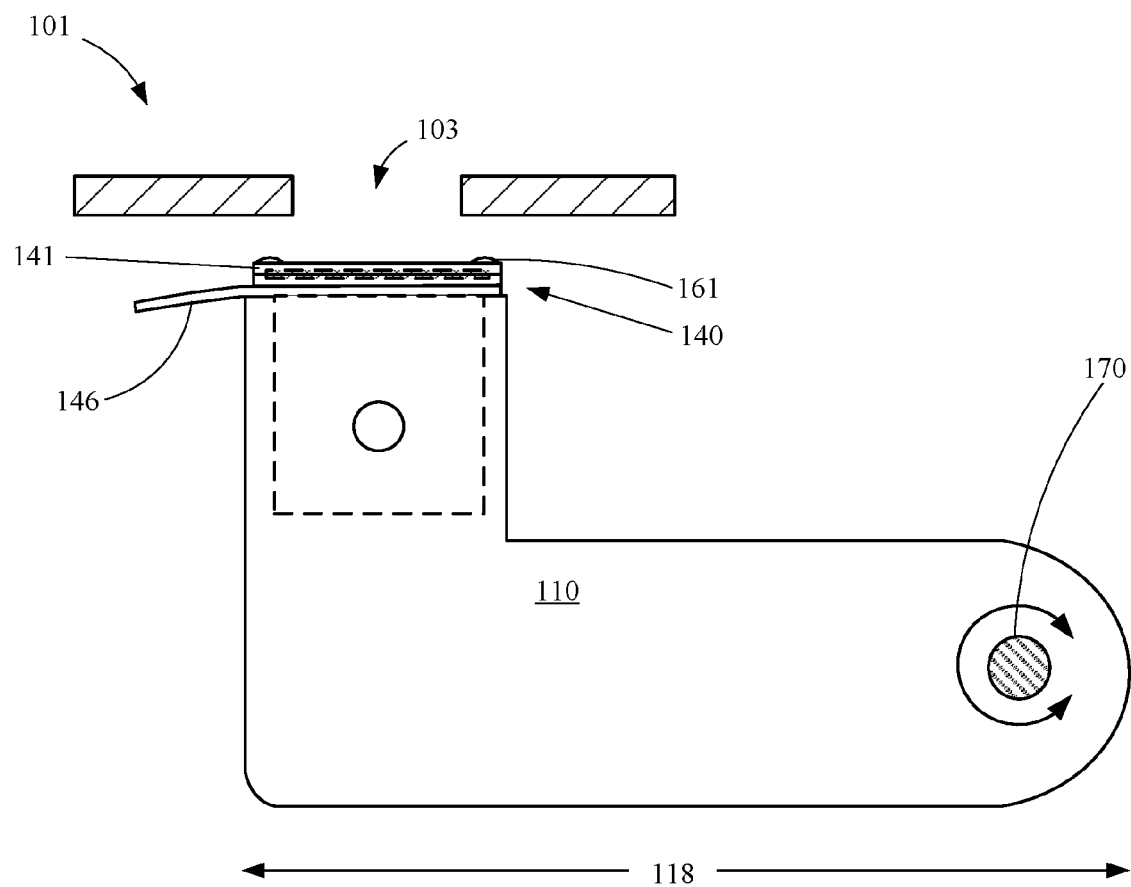
FIG. 11 shows a top view of an embodiment of a fixture.

FIG. 11 illustrates a top view of showing release layer 146 attached to component 140 on a first surface of release layer 146, and release layer 146 attached to fixture 110 on a second surface of release layer. Also, fixture 110 includes length 118. Length 118 may be approximately in the range of 10 mm to 420 mm. Generally, length 118 is such that when fixture 110 is rotated around column 170 in a direction toward housing 101, component 140 is substantially parallel to housing 101 when component 140 is proximate to housing 101. Also, as shown in FIG. 11, PSA 161 is applied a surface first portion 141 of component 140. When component 140 is properly aligned with aperture 103, the amount of PSA 161 used to attach component 140 with housing 101 is such that PSA 161 sufficient holds component 140 to housing 101 but does not intrude into any portion of aperture 103.

Also, in some embodiments, several light sensors may be positioned around the fixture. Each light sensor could transmit a light intensity to a controller. The controller may use the readings from the light sensors to calculate a local maximum of the light, and actuate the fixture and component accordingly. Also, although not shown, some embodiments may include a light sensor external with respect to the housing of the device and a light within the housing of the device. This may be advantageous where the light sensor readings are critical and any movement of the light sensor is undesirable.

Figure 12:
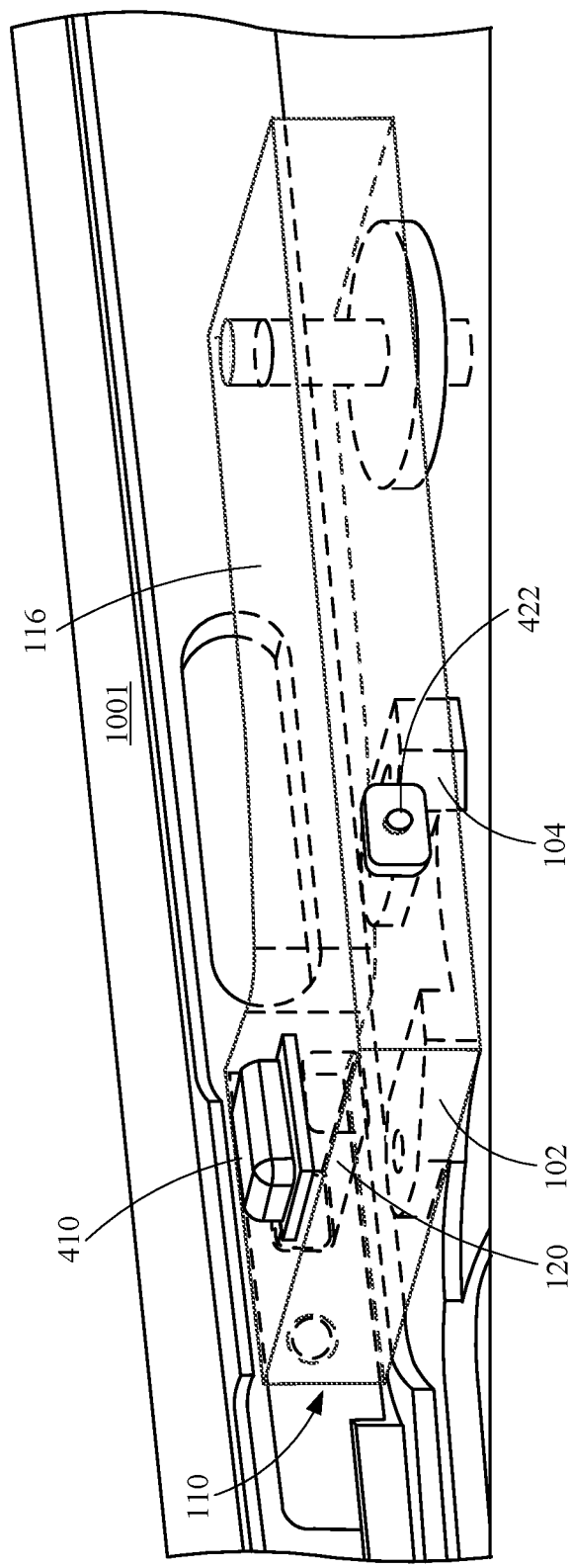
FIG. 12 shows an isometric view of an embodiment of a system used to test for proper installment of a component in an electronic device.

Some embodiments may include a test in order to confirm the component is properly attached to the housing. FIG. 12 illustrates an acoustical test to determine whether the component is proper installed on the housing. The acoustical test includes a microphone 410 on top surface 116 of fixture 110, generally above chamber 120. The acoustical test also includes a speaker (shown later) configured to emit sound into chamber 120 through an aperture of housing 1001. In some embodiments, the acoustical test is performed after the alignment process (previously described) and subsequent installation of the acoustical seal.

FIG. 12 further shows housing 1001 including first alignment block 102 and second alignment block 104, both of which are configured to guide fixture 110 such that the component is properly aligned with housing 1001. Fixture 110 may slide along a surface of first alignment block 102 and second alignment block 104. In some embodiments, housing 1001 includes only a first alignment block 102. In other embodiments, housing 1001 includes three or more alignment blocks. Still, in other embodiments, housing 1001 may not have an alignment block (similar to housing 101 shown in FIG. 1). First alignment block 102 and second alignment block 104 may serve as a substitute to the alignment process previously described. However, it should be understood that in some embodiments alignment blocks may be used in conjunction with the alignment process. Also, the acoustical test may be initiated by switch 422 on fixture 110. Switch 422 may be electrically connected to microphone 410 and/or the speaker. In some embodiments, switch 422 is electrically connected to a controller (not shown). Also, switch 422 may be further configured to set the PSA so the component may be installed.

Figure 13:
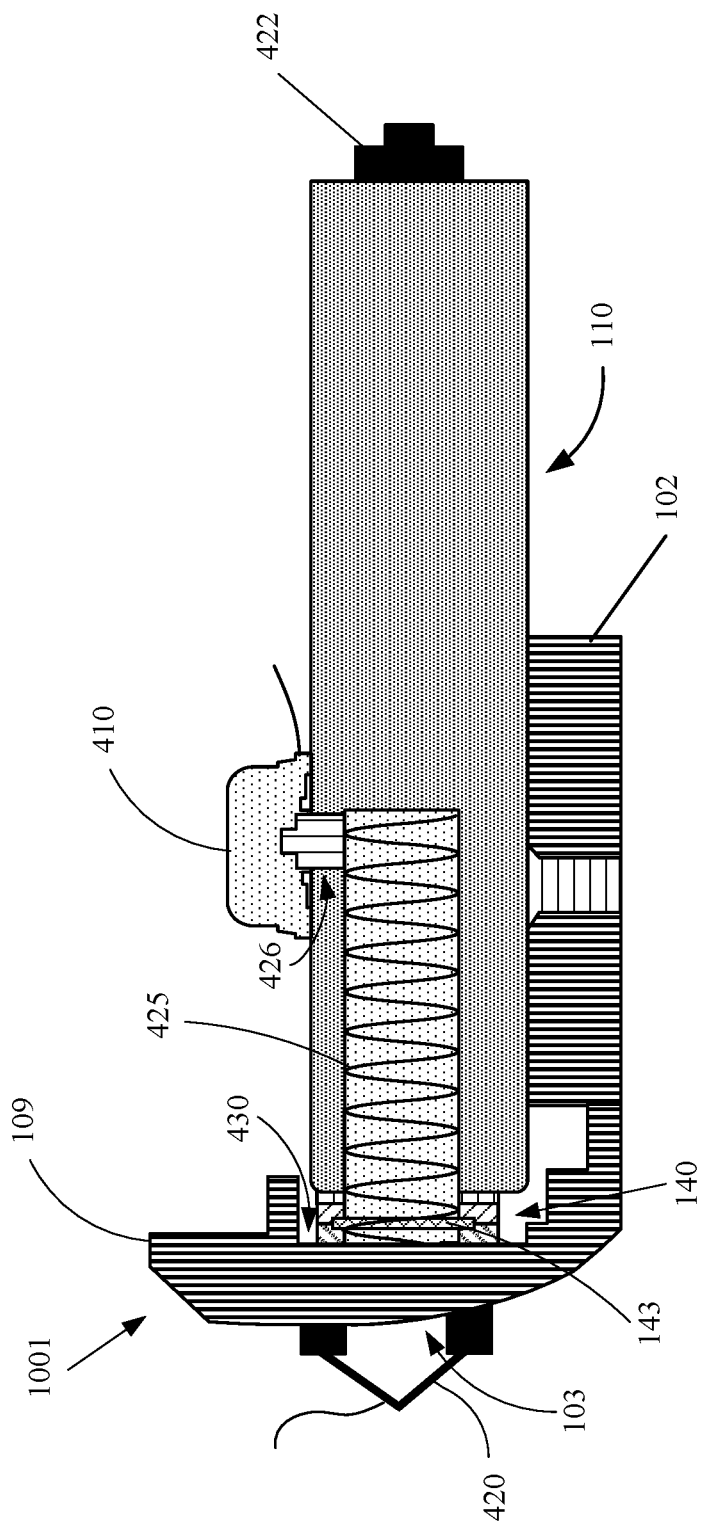
FIG. 13 shows a cross sectional view of the embodiment of the system shown in FIG. 12 with an audio speaker emitting sound into a chamber of a fixture.

FIG. 13 illustrates a cross sectional view of a system for the acoustical test which includes microphone 410 on fixture 110, audio speaker 420 attached to an outer portion of housing 1001, and switch 422. Housing 1001 includes first alignment block 102 to ensure component 140 is aligned with aperture 103 before installing component 140. Audio speaker 420 is attached to housing 1001 such that audio speaker 420 transmits a test sound (shown as sound wave 425) in a direction through aperture 103, component 140, release layer 146, and ultimately into chamber 120. As stated previously, mesh portion 143 is made of material(s) which allow sound transmission to permeate through mesh portion 143. Audio speaker 420 may be configured to transmit any sound from an audio transmission device (not shown). Also, microphone 410 generally detects sound transmissions from any source that emits sound. This may include, for example, ambient noise in a device assembly plant. Also, both microphone 410 and audio speaker 420 may be attached to a controller (not shown) previously described.

It will be appreciated that release layer 146 is acoustically sealed with fixture 110 a surface of release layer, and acoustically sealed to component 140 on another surface of release layer 146. In some embodiments (not shown), component 140 may be directly attached to fixture 110 (that is, no release layer 146). When component 140 is directly attached to fixture 110, component 140 is acoustically sealed with fixture 110.

FIG. 13 also shows interface region 430. Interface region 430 is a portion in which component 140 engages housing 101, and extends around an outer perimeter of component 140. Generally, interface region 430 is a region most likely to emit sound transmission from audio speaker 420 when component is not acoustically sealed with housing 1001. To determine whether component 140 was properly installed, audio speaker 420 emits a sound transmission ("test sound"). If microphone 410 does not detect sound transmission from audio speaker 420 through an interface region 430, component 140 is acoustically sealed with housing 1001, and therefore properly installed. However, if microphone 410 detects sound transmission from audio speaker 420 through interface region 430, acoustical seal 140 is not acoustically sealed with housing 101, and therefore improperly installed on housing 101. In the latter event, the controller may subsequently signal to another member of the assembly line to remove housing 1001 having an improperly installed component 140. As previously noted, this combined assembly and test step occurs relatively early in the assembly process. Accordingly, when a misaligned component 140 is detected, no further assembly to housing 1001 is performed. This not only lowers cost associated with installing additional components on a device that will ultimately not be sold, but also allows another device to be assembled in place of the device having a misaligned component 140.

In some embodiments, the controller may signal the audio transmission device to transmit a sound through audio speaker 420 in a predetermined frequency range in which microphone 410 is configured to receive. Accordingly, microphone 410 may ignore other ambient noises not within the predetermined range. In other embodiments, the acoustical test may include a second microphone (not shown) configured to receive sound transmission from, for example, ambient noise, allowing the acoustical test to "ignore" ambient noise. For example, the controller may receive transmission from microphone 410 and the second microphone, reduce each transmission into a mathematical computation, and subtract sound transmission of the second microphone from sound transmission from microphone 410. The controller may then analyze the resultant sound transmission to determine whether microphone 410 received sound transmission from audio speaker 420.

For the acoustical test to perform properly, microphone 410 should be capable of detecting sound transmission from audio speaker 420, if at all, only through portions such as interface region 430. It is essential, therefore, that audio speaker 420 be properly secured to housing 101 such that sound transmission from audio speaker 420 passes only through aperture 103. Alternatively, it may be necessary to acoustically block sound transmission from audio speaker 420 passing over top portion 109 (shown in FIG. 13) of housing 101. Also, although sounds wave 425 extend through chamber 120, sound wave 425 do not extend through cavity 126 in a manner such that they may be detected by microphone 410. Further, fixture 110 is made of material(s) such that sound wave 425 generally do not pass through fixture 110.

Figure 14:
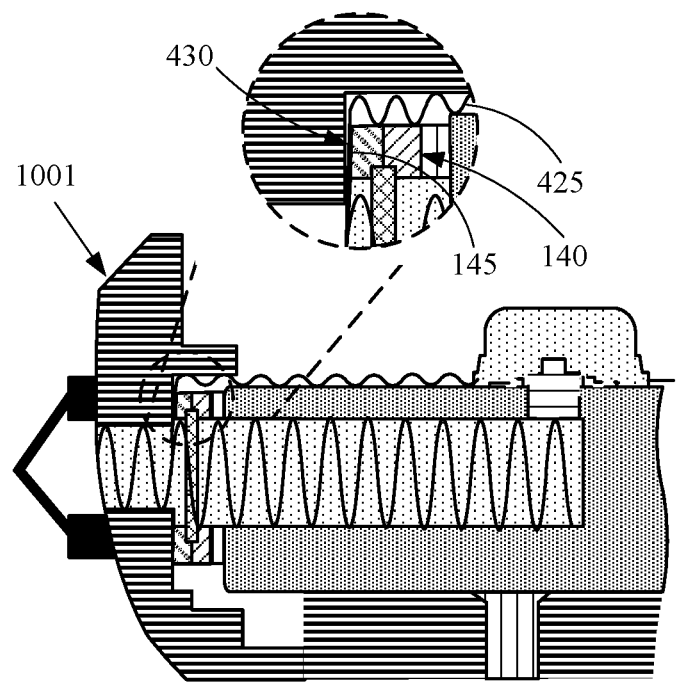
FIGS. 14 and 15 show cross sectional views of improper alignment of a component on an electronic device.
Figure 15:
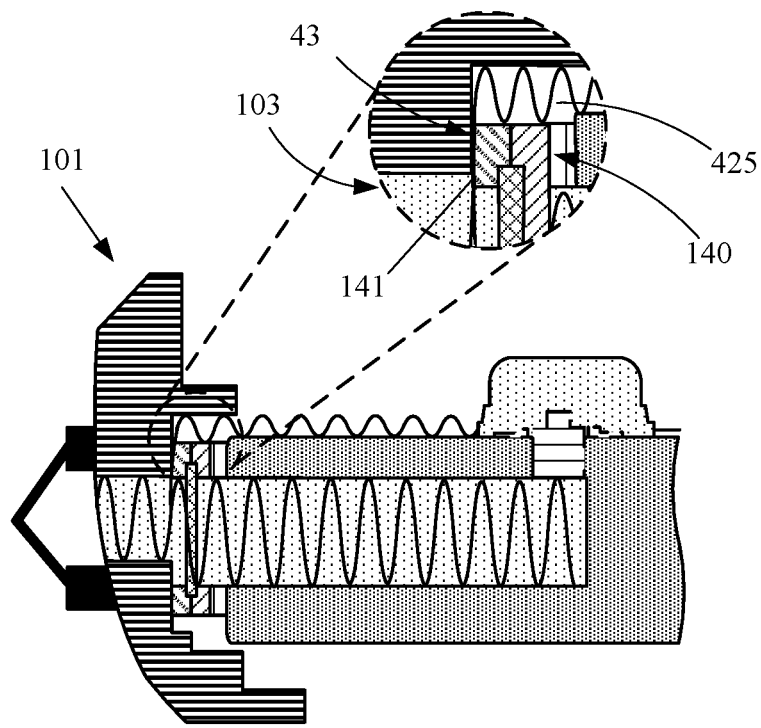

Installation issues (corresponding to a failure event) of component 140 may happen for several reasons. For example, FIG. 14 illustrates component 140 having a slanted surface 145. In other words, slanted surface 145 is not substantially parallel with the inner portion of housing 1001 where component 140 is generally installed. This may be due to, for example, a manufacturing flaw of component 140. Installation issues also include misalignment of a properly manufactured component 140. In FIG. 15, for example, component 140 is installed on housing 101 (shown also in FIG. 1) at a portion lower than that of a properly aligned component 140. In particular, a lower edge of component 140 is lower than aperture 103 of housing 101. In both cases, sound wave 425 may be permitted to extend through interface region 430 and be detected by microphone 410. Also, installation issue may also derive from improperly setting PSA on, for example, the component 140. This may create gaps between the PSA and component 140 thereby allowing sound wave 425 to pass through interface region 430.

Figure 16:
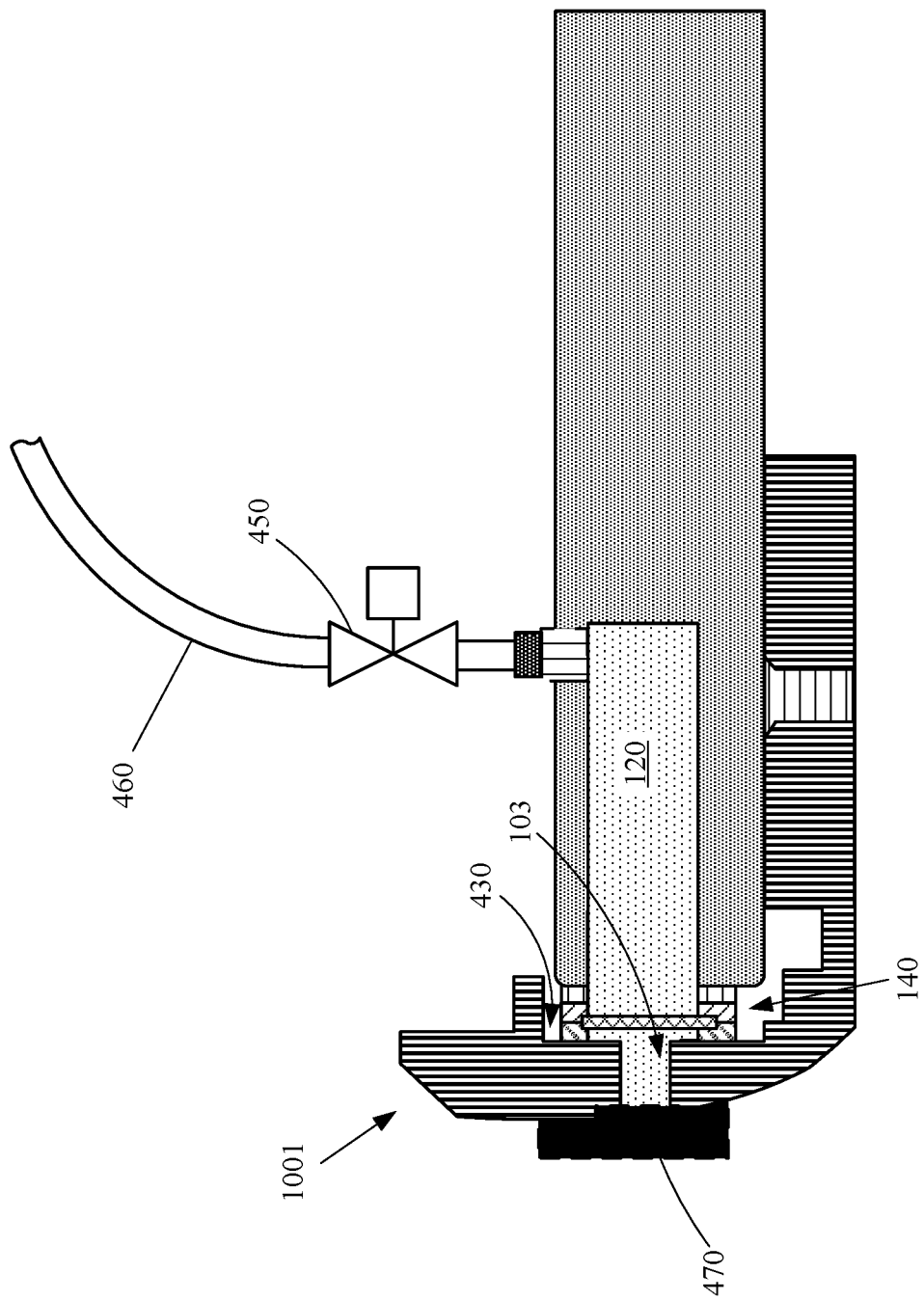
FIG. 16 shows an alternate embodiment of a system used to test for proper installment of a component in an electronic device.

Other tests may be performed to ensure component 140 is properly installed. For example, FIG. 16 illustrates a test system using valve 450 connected to air line 460, and seal 470 configured to plug aperture 103. In some embodiments, valve 450 is a pneumatic valve. Also, in some embodiments, air line 460 may receive air through an air compressor, or an air pump. In this test, air is supplied to chamber 120 of fixture 110 through air line 460 and valve 450. If air does not escape through interface region 430, component 140 has been properly installed. However, if air escapes through interface region 430, component 140 has been improperly installed. Determining air escape may be performed by monitoring pressure loss in chamber 120 or placing a structure near interface region 430 configured to move when air from interface region 430 contacts the structure. Manual means for determine determining proper installation of component 140 may also be performed. For example, air passing through interface region 430 may make a sound audible to an operator thereby indicating to the operator that component 140 is improperly installed. These air tests described herein may also be a combined assembly and test step performed relatively early in the manufacturing process.

Figure 17:
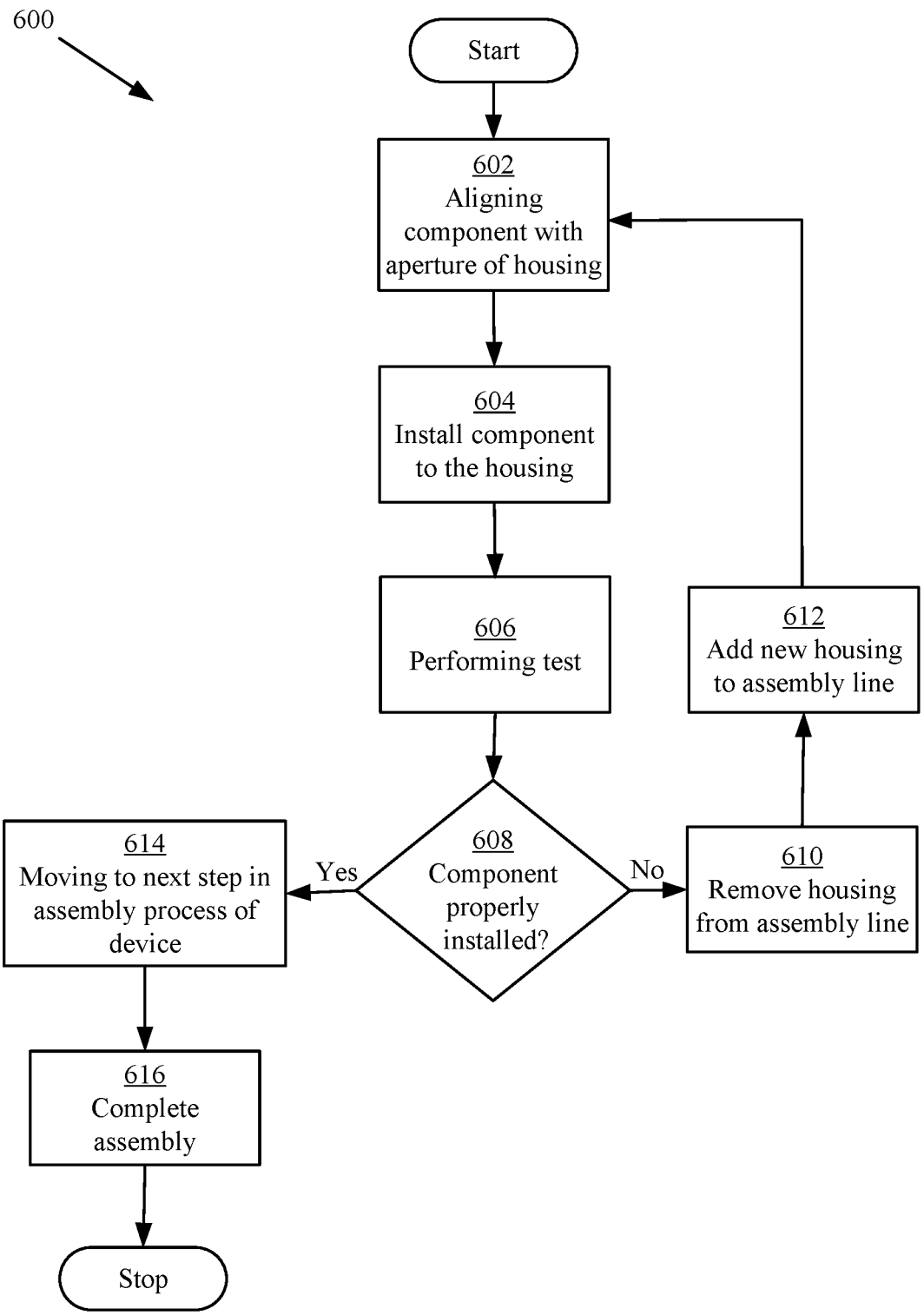
FIG. 17 shows a flow chart of a testing process in accordance with the described embodiments.

FIG. 17 illustrates a flow chart 600 for assembling and testing installment of a component. In step 602, the component is aligned with the aperture of the housing. Of course, this step is performed before installing the component. Alignment may be performed by the alignment process previously described (using at least a light and at least a light sensor), and/or using alignment blocks on the housing of the device. Then, in step 604, the component is installed to the housing. This may performed, for example, by rotating or swiveling a fixture (lever) around a longitudinal axis of a column extending through the fixture. Then, in step 606, a test is performed to determine if the component is properly installed on the housing. Testing may include any test for installment previously described (for example, the acoustical test). If the test indicates the component is not properly installed, in step 610, the housing is removed from the assembly line. Then, in step 612, the discarded housing is replaced by a new housing on the assembly line and the process is repeated at step 602. If, however, the test indicates the component is properly installed, then in step 614, the housing is moved to the next step of the assembly process. In step 616, the assembly process is completed by installing the remaining components necessary to make the device.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A method for aligning and installing a component with an electronic device having a housing that includes a housing aperture, the method comprising:
    securing the component with a fixture, the component comprising a component aperture;
    providing, from a light source, light having a maximum intensity that passes through the housing aperture and the component aperture to a light sensor carried by the fixture, the maximum intensity associated with a central portion of the light;
    actuating the fixture perpendicular with respect to the light such that the light sensor detects the maximum intensity; and
    actuating the fixture toward the housing to secure the component with the housing.

2. The method as recited in claim 1, wherein the light source is external with respect to the housing.

3. The method as recited in claim 1, further comprising:
    detecting, with the light sensor, a first intensity of the light less than the maximum intensity at a first portion of the light, the first portion different from the central portion;
    detecting, with the light sensor, a second intensity of the light less than the maximum intensity at a second portion of the light with the light sensor, the second portion different from the central portion; and
    determining the maximum intensity based on the first intensity and the second intensity.

4. The method as recited in claim 1, wherein providing, from the light source, the light comprises providing the light that passes through a mesh portion of the component.

5. The method as recited in claim 1, wherein the fixture includes a chamber defining an opening of the fixture.

6. The method as recited in claim 5, wherein the light sensor is positioned within the chamber.

7. The method as recited in claim 5, wherein the opening of the fixture is similar to the component aperture.

8. The method as recited in claim 1, wherein securing the component with the housing comprises:
    adhesively attaching the component to an interior region of the housing such that the housing aperture is aligned with the component aperture.

9. The method as recited in claim 8, further comprising, subsequent to the adhesively attaching the component, performing a test to determine an alignment of the component on the housing.

10. The method as recited in claim 1, wherein actuating the fixture comprises:
    actuating the fixture in accordance with a first direction to determine a first plurality of light intensities;
    actuating the fixture in accordance with a second direction to determine a second plurality of light intensities different from the first plurality of light intensities; and
    determining the maximum intensities based on the first plurality of intensities and the second plurality of intensities.

11. The method as recited in claim 10, wherein the first direction is perpendicular with respect to the second direction.

12. The method as recited in claim 10, wherein securing the component with the housing comprises acoustically sealing the component with the housing.

* * * * *